United States Patent [19]

Daniel

[11] 4,142,143

[45] Feb. 27, 1979

[54] LIGHTNING GROUND SYSTEM ATTACHABLE ADMITTANCE TESTING INSTRUMENT

[75] Inventor: Richard A. Daniel, Kingston, Wash.

[73] Assignee: The United States of America as represented by the Secretary of the Navy, Washington, D.C.

[21] Appl. No.: 852,895

[22] Filed: Nov. 18, 1977

[51] Int. Cl.² .................. G01R 31/02; G01R 27/00
[52] U.S. Cl. ............................. 324/51; 324/57 R; 324/127
[58] Field of Search ............... 324/51, 233, 240, 30 A, 324/4, 6, 127, 57 R

[56] References Cited

U.S. PATENT DOCUMENTS

| | | | |
|---|---|---|---|
| 2,995,699 | 8/1961 | Snelling et al. | 324/4 |
| 3,015,060 | 12/1961 | McLaughlin et al. | 324/4 |
| 3,603,873 | 9/1971 | Cirulis | 324/30 A |
| 3,614,600 | 10/1971 | Ronka | 324/4 |
| 4,075,675 | 2/1978 | Burkett et al. | 324/51 X |

Primary Examiner—Gerard R. Strecker
Attorney, Agent, or Firm—R. S. Sciascia; Charles D. B. Curry

[57] ABSTRACT

An instrument for measuring the resistive and reactive components of electrical circuits without physical contact or breaking the circuits. The instrument consists of a transmitter, a receiver, a sensor head, a power supply, and a display. The sensor head is constructed of two transformer cores split and hinged so that it can be closed around part of the circuit to be tested. One transformer core is driven by an oscillator and induces ac voltage in the test circuit. Current flow depends upon the electrical characteristics, admittance, of the test circuit. The other transformer core acts as a receiver and its output is an ac voltage proportional to the current flowing in the test circuit. The ac signal is detected using a synchronous detector with reference derived from the transmitter, either in phase to measure the resistive component, or with a 90° phase shift to measure the reactive component.

6 Claims, 9 Drawing Figures

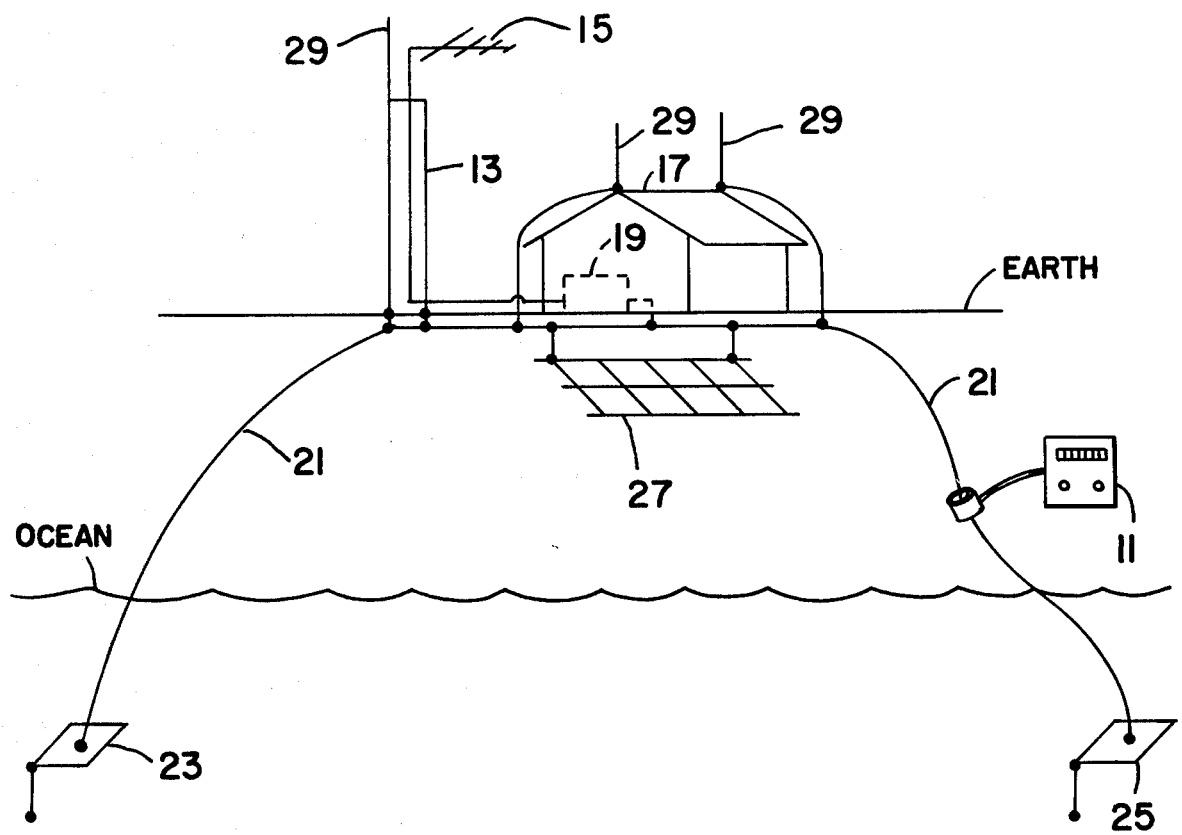
FIG_1A
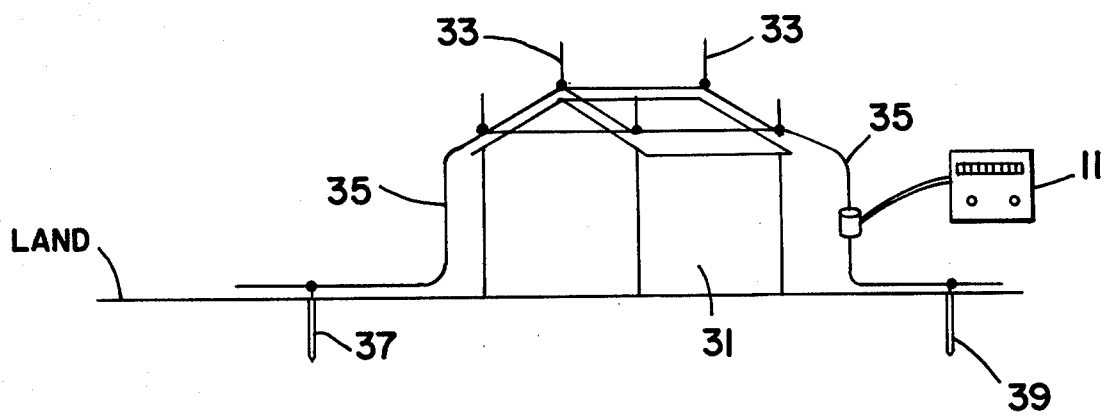
FIG_1B

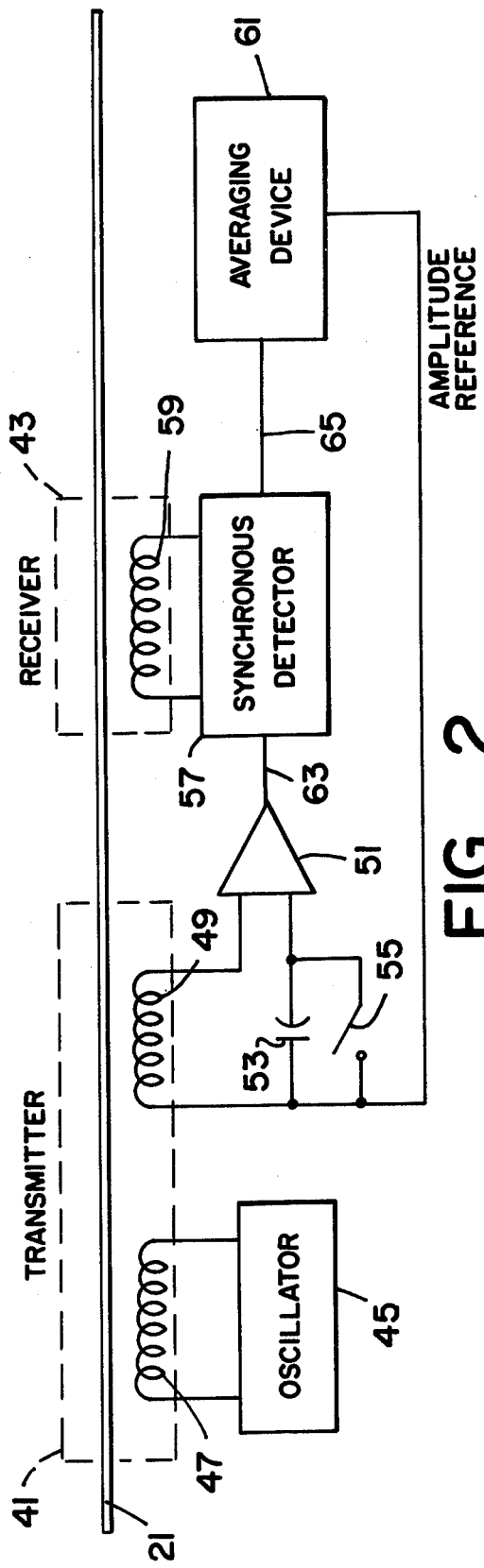
FIG_2
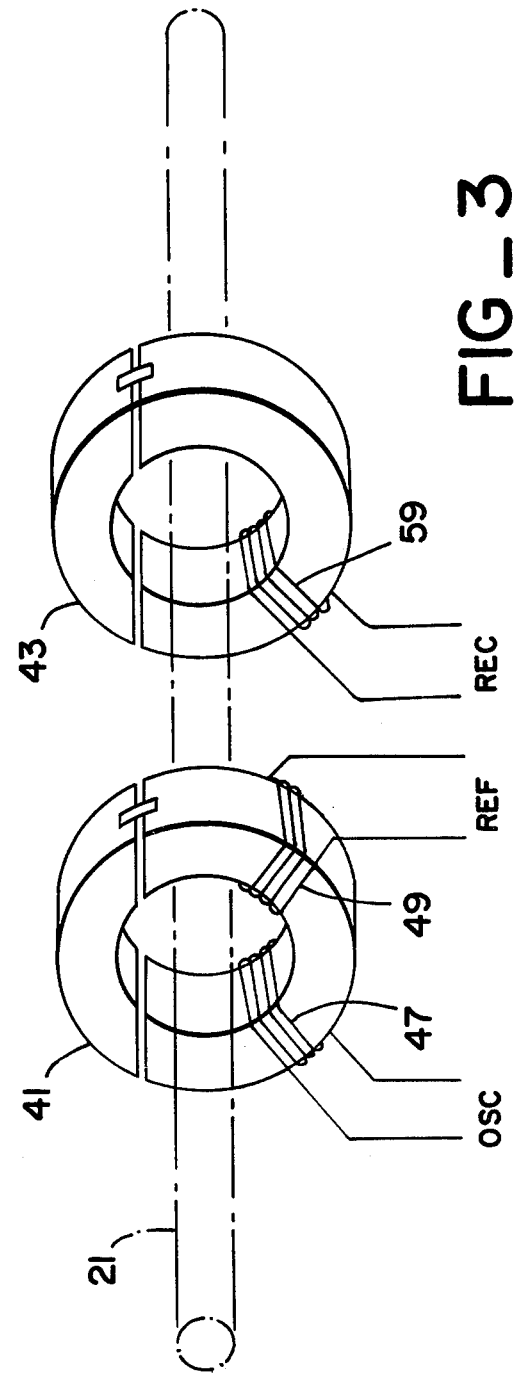
FIG_3

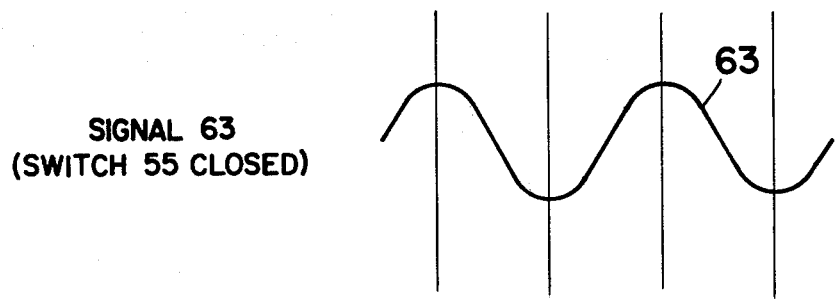
SIGNAL 63
(SWITCH 55 CLOSED)
FIG_4A
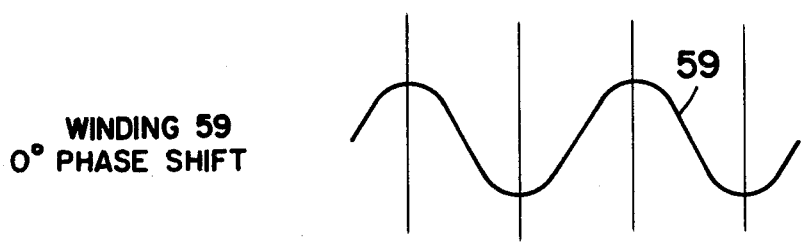
WINDING 59
0° PHASE SHIFT
FIG_4B
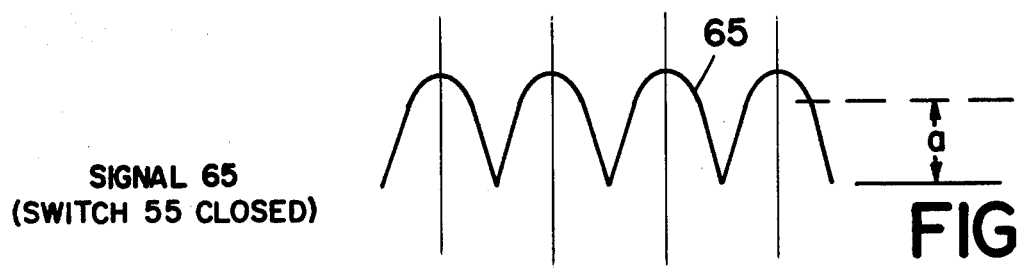
SIGNAL 65
(SWITCH 55 CLOSED)
FIG_4C
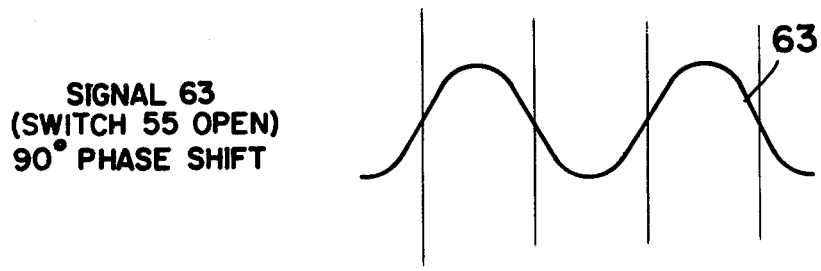
SIGNAL 63
(SWITCH 55 OPEN)
90° PHASE SHIFT
FIG_4D
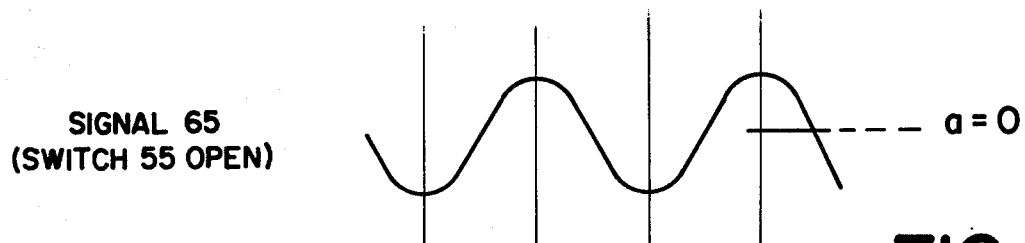
SIGNAL 65
(SWITCH 55 OPEN)
FIG_4E

LIGHTNING GROUND SYSTEM ATTACHABLE ADMITTANCE TESTING INSTRUMENT

BACKGROUND OF THE INVENTION

1. Field of the Invention

The present invention relates to a lightning ground system testing instrument and more particularly to an attachable lightning ground testing instrument that measures the admittance of electrical circuits without physical contact or breaking the circuits.

2. Description of the Prior Art

Lightning ground systems are used on buildings, towers, and other structures throughout the world. There are basically two types of tests that are employed on these lightning ground systems to assure their integrity and proper performance. One is by performing test measurements on a ground system that has been interrupted and the other is by performing test measurements on a ground system that has not been interrupted. In situations where the ground system is not interrupted there are two normally employed testing methods. One is by physical inspection and the other is generally referred to as the ground megger test. The physical inspection of ground systems has the primary disadvantage of not being able to visually observe many types of electrical and mechanical defects in the ground system. In the ground megger test two stakes are driven into the ground at predetermined positions from the grounding stake. A current is passed from the grounding stake to the furthest stake and a test voltage is measured at the center stake. This method depends upon uniform earth conditions and cannot be used to test ocean grounding systems. In situations where the ground system is interrupted, a testing instrument is normally placed in series with the opened circuit of the ground system. This has the disadvantage of not being certain the ground system is operational after it has been closed following the test. In addition, opening the circuit may introduce errors, especially if circuit resistance is small, as in a ground system.

The present invention overcomes these problems by providing an admittance measuring instrument that is particularly useful for testing lightning ground systems in that it provides reliable test information without interruption of the ground system.

SUMMARY OF THE INVENTION

Briefly, the present invention comprises an instrument for measuring the resistive and reactive components of electrical circuits without physical contact or breaking the circuits. The instrument consists of a transmitter, a receiver, a sensor head, a power supply, and a display. The sensor head is constructed of two transformer cores split and hinged so that it can be closed around part of the circuit to be tested. One transformer core is driven by an oscillator and induces ac voltage in the test circuit. Current flow depends upon the electrical characteristics, admittance, of the test circuit. The other transformer core acts as a receiver and its output is an ac voltage proportional to the current flowing in the test circuit. The ac signal is detected using a synchronous detector with reference derived from the transmitter, either in phase to measure the resistive component, or with a 90° phase shift to measure the reactive component.

STATEMENT OF THE OBJECTS OF THE INVENTION

An object of the present invention is to provide an instrument for measuring admittance;

Another object of the present invention is to provide an instrument that is particularly useful for testing lightning ground systems;

Still another object of the present invention is to provide an instrument for measuring the admittance of a circuit without breaking or interrupting the circuit;

Other objects, advantages and novel features of the invention will become apparent from the following detailed description of the invention when considered in conjunction with the accompanying drawings wherein:

BRIEF DESCRIPTION OF THE DRAWINGS

FIGS. 1A and 1B are schematic drawings of two typical lightning ground systems;

FIG. 2 is a schematic diagram of the admittance instrument of the present invention;

FIG. 3 is a schematic drawing of the windings and transformer cores used in the instrument of FIG. 2; and FIGS. 4A through 4E are drawings illustrating the operation of the circuit shown in FIG. 2.

DESCRIPTION OF THE PREFERRED EMBODIMENT

In FIGS. 1A and 1B are illustrated two conventional types of lightning ground systems with which the lightning ground testing instrument 11 of the present invention may be used. The details of the lightning ground system attachable admittance testing instrument 11 of the present invention are shown in FIGS. 2, 3, and 4A through 4E. The FIG. 1A lightning ground system is generally referred to as the sea water ground system and may include a tower 13 that is supporting an antenna 15, a communications building 17 that includes communication receiving and transmitting equipment 19. The basic elements of the grounding system includes a single continuous exposed wire grounding cable 21, which may be 2/0 woven cable having an about ½ inch diameter, and grounding plates 23 and 25. One end of cable 21 is connected to grounding plate 23 and the other end is connected to grounding plate 25. Each of grounding plates 23 and 25 are under the ocean surface and depend upon good electrical contact with conductive sea water for grounding. A metal grounding grid 27 may be positioned under the building 17 and a plurality of lightning rods 29 are also provided. To provide a system ground all of the various elements, such as the lightning rods 29, tower 13, grid 27, the ground element of the antenna coaxial cable, and communication equipment are connected by separate grounding cables and by clamps or the like to the grounding cable 21. The FIG. 1B grounding system is generally referred to as the earth grounding system and may include a building 31, having a plurality of lightning rods 33, a continuous exposed wire grounding cable 35 such as 2/0 woven cable. The ends of cable 35 are respectively connected to stakes 37 and 39 that are driven into the ground.

It is necessary to periodically test each of the FIG. 1A and FIG. 1B grounding systems to determine if they are properly grounded. Systems of this type are often very old and deteriorated, especially since they are continuously exposed to the natural elements. It has been found that the testing of these systems is best achieved by measuring their admittance. That is, it is desirable and necessary to determine the resistive, capacitive and inductive reactance of the total grounding loop including the cable per se, the parallel sea water and underwater ground loop, as shown in FIG. 1A, or the cable and earth as shown in FIG. 1B. It should be noted that these ground loops may have both inductive and capacitive coupling due to the existence of the ground cable per se. Also inductive coupling may be caused by the cable breaking or a capacitor may be series connected with the ground cable to provide only an ac ground. Often it is desirable to measure the system resistive, capacitive and inductive reactance immediately after it has been initially installed and then use these measurements as a standard for future tests to determine if the system was deteriorated.

One of the major problems in testing grounding systems is that it is highly desirable to maintain the physical integrity of the cable, stakes and plates. In many instances local safety codes and regulations prohibit disrupting the system by breaking or cutting the cable or removing the stakes or plates to test the system. Therefore, testing is generally limited to physical inspection or, in the case of the earth grounding system of FIG. 1B, testing of resistance only by so called ground megger. The ground megger test involves driving two additional stakes into the ground at predetermined positions from one of the grounding stakes. A current is then passed from the grounding stake to the furthest stake and a test voltage is measured at the center stake. In accordance with the lightning testing system of the present invention it is possible to not only test the grounding system without in any way interrupting the system or destroying its physical integrity, but it is possible to measure its admittance including resistive, inductive and capacitive reactances without installing additional reference grounds.

In FIG. 2 is shown a schematic diagram of the lightning ground system attachable admittance testing instrument 11 of the present invention. Instrument 11 includes transformer core 41 and transformer core 43. An oscillator 45 is coupled to transformer core 41 by transmitter winding 47. Also coupled to transformer core 41 is reference winding 49. One side of reference winding 49 is connected to one input of operational amplifier 51 and the other side is connected in parallel to one side of capacitor 53 and to one pole of switch 55. The other side of capacitor 53 and the other pole of switch 55 are connected to the other input of operational amplifier 51. It is important to note that operational amplifier 51 provides virtually zero input impedence and is therefore responsive to current rather than voltage and thus enables a 90° phase shift in the reference signal by opening switch 55. The output of operational amplifier 51 is connected to one input of synchronous detector 57 and the other input is connected to receiver winding 59 which is coupled to transformer core 43. Synchronous detector 57 functions to multiply the two inputs and takes into account phase relationships as hereinafter described in detail. The output of synchronous detector 57 is applied to the input of an averaging device 61 such as an average reading dc voltmeter. An amplitude reference is applied to the other input of the averaging device 61 by connecting one side of reference winding 49 thereto.

Referring to FIGS. 2 and 3, transmitter winding 47 is coupled to the ground cable 21 (or 35) by providing a hinge and latch transformer core 41 such that the core may be opened and then closed around the grounding cable 21. It is important that cores 41 and 43 be isolated from electromagnetic coupling except by the coupling induced by cable 21 in accordance with the present invention.

OPERATION

Transformer core 41 is driven by oscillator 45. Through core 41 winding 47 induces an ac voltage in reference winding 49 and in grounding cable 21. Current flow in the grounding cable 21 depends upon the electrical characteristics (admittance) of the grounding cable and associated grounding systems. Transformer core 43 acts as a receiver and its output is an ac voltage proportional to the current flowing in the grounding cable 21. This ac signal is induced into winding 59 and is detected by synchronous detector 57, with reference derived from the reference winding 49 (which has the same phase as the signal in the transmitter winding 47). The signals in windings 49 and 59 will be either in phase (switch 55 being closed) to measure the resistive component, or 90° out of phase (switch 55 being open) to measure the reactive component.

The grounding cable system admittance is defined by the relationship $$Y = \frac{1}{R} + j\left(\frac{1}{X_L} - \frac{1}{X_c}\right)$$

where:
Y = admittance
R = resistance
$X_L$ = inductive reactance
$X_c$ = capacitive reactance
j = imaginary operator $$j\left(\frac{1}{X_L} - \frac{1}{X_c}\right) = \text{susceptance}$$

In actual practice the induced signal in winding 59 will be from a circuit having both resistance and reactance. However, in FIGS. 4A–4F is shown a simplified situation where the induced signal is from a circuit having pure resistance for purpose of illustration. FIG. 4A shows signal 63 when switch 55 is closed. In this situation signal 63 will be in phase with the signal induced in winding 59 (assumed to be only resistive) as shown in FIG. 4B. These two signals will be multiplied in synchronous detector 57 and produce the signal shown in FIG. 4C. Averaging device 61 will provide an output "a" which is the average of signal 65. It should be noted that the system may be calibrated by putting a loop of cable or wire, having known admittance, in the circuit in place of cable 21. This will provide a voltage reference to which actual readings can be compared. Assume now that the signal 59 is purely resistive as shown in FIG. 4B and switch 55 is open. Then the signal 63 will have a 90° phase shift as shown in FIG. 4D. In this situation signal 65 will have the wave form shown in FIG. 4E and the output of averaging device 61 will be a = 0. It will be obvious to one skilled in the art that the reverse situations will occur when the signal induced in winding 59 is only capacitive. Moreover, in actual situations there is generally both resistive and reactive components making up the signal induced in winding 59. Therefore, the output of averaging device 61 will have a finite value when switch 55 is closed. These values, when compared to a standard, will indicate the actual resistance and reactance of the system being tested.

The following table defines the elements used in one embodiment of the instrument of the present invention. It will be obvious to one skilled in the art that these values may be varied provided they are compatible with the teaching of the present invention:

oscillator 45—160 KHz
coil 47—20 turn of #22 wire
coil 49—40 turn of #22 wire
cores 41 & 43—2" diameter, 1" width iron or ferrite
winding 59—40 turns of #22 wire
amplifier 51—AD 518K operational amplifier
synchronous detector—AD 531K
averaging device—AD 2026 digital panel meter and display.

What is claimed is:

1. An instrument for measuring admittance comprising:
   (a) a first transformer core having a transmitter and a reference winding, capable of coupling with a cable to be tested;
   (b) an oscillator, the output of which is coupled through said transmitter winding to said first transformer core to impart an alternating current voltage in said reference winding and in said cable;
   (c) an amplifier, one input being connected to one side of said reference winding;
   (d) a phase shifting component;
   (e) selector means for selectively coupling the output of the other side of said reference winding directly or through said phase shifting component to the other input of said amplifier;
   (f) a second transformer core having a receiver winding, capable of coupling with said cable being tested;
   (g) detection means for multiplying input electrical signals, one input being connected to the output of said amplifier and the other input being coupled through said receiver winding to said second transformer core;
   (h) an averaging device, one input being connected to the output of said detection means and the other input being coupled through one side of said reference winding to said first transformer core to compare said reference winding voltage with said receiver winding voltage; whereby
   (i) when said selector means directly couples said reference winding to the input of said amplifier said averaging means indicates the resistive component of admittance and when said selector means couples said reference winding through said phase shifting component to the input of said amplifier said averaging means indicates the reactive component of admittance.

2. The instrument of claim 1 wherein:
   (a) said amplifier comprises a low impedence operational amplifier.

3. The instrument of claim 2 wherein:
   (a) said selector means and siad phase shifting component comprises a switch and a capacitor connected in parallel.

4. The instrument of claim 3 wherein:
   (a) said detection means comprises a synchronous detector.

5. The instrument of claim 4 wherein:
   (a) said first and second transformer cores each include a hinged element whereby said cores may be coupled around a cable to be tested without breaking said cable.

6. A ground system attachable admittance testing instrument comprising:
   (a) a hinged first transformer core having a transmitter and a reference winding, capable of coupling around a cable to be tested without breaking said cable;
   (b) a low frequency oscillator, the output of which is coupled through said transmitter winding to said first transformer core to impart an alternating current voltage in said reference winding and in said cable;
   (c) a low input impedance operational amplifier, one input being connected to one side of said reference winding;
   (d) a capacitor and a switch connected in parallel, coupling the other side of said reference winding to the other input of said amplifier;
   (e) a hinged second transformer core having a receiver winding, capable of coupling around a cable to be tested without breaking said cable, to be imparted with the alternating current voltage the cable has transmitted;
   (f) a synchronous detector for multiplying two input electrical signals, one input being connected to the output of said operational amplifier and the other input being coupled through said receiver winding to said second transformer core;
   (g) an averaging device, one input being connected to the output of said synchronous detector and the other input being coupled through one side of said reference winding to said first transformer core to compare said reference winding voltage with said receiver winding voltage, whereby
   (h) when said switch is closed directly coupling said reference winding to the input of said amplifier said averaging means indicates the resistive component of admittance and when said switch is open coupling said reference winding through said capacitor to the input of said operational amplifier said averaging means indicates the reactive component of admittance.

* * * * *